United States Patent
Ihara et al.

(10) Patent No.: US 6,700,761 B2
(45) Date of Patent: Mar. 2, 2004

(54) MAGNETIC SENSOR

(75) Inventors: Nobutaka Ihara, Kawasaki (JP);
Hiroyoshi Kodama, Kawasaki (JP);
Takuya Uzumaki, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 103 days.

(21) Appl. No.: 09/799,949

(22) Filed: Mar. 6, 2001

(65) Prior Publication Data

US 2001/0053052 A1 Dec. 20, 2001

(30) Foreign Application Priority Data

Jun. 12, 2000 (JP) .................................. 2000-175863

(51) Int. Cl.[7] .................................................. G11B 5/39
(52) U.S. Cl. ...................................... 360/327; 360/324.1
(58) Field of Search ............................. 360/324.1, 327, 360/324; 428/692, 693; 338/32 R; 324/207.21, 252

(56) References Cited

U.S. PATENT DOCUMENTS

| | | | | |
|---|---|---|---|---|
| 5,390,061 A | * | 2/1995 | Nakatani et al. | 360/324.2 |
| 5,416,353 A | * | 5/1995 | Kamiguchi et al. | 257/421 |
| 5,422,571 A | * | 6/1995 | Gurney et al. | 324/252 |
| 5,463,516 A | * | 10/1995 | Valet et al. | 360/254.3 |
| 5,654,566 A | * | 8/1997 | Johnson | 257/295 |
| 5,691,865 A | * | 11/1997 | Johnson et al. | 360/324.2 |
| 6,064,552 A | * | 5/2000 | Iwasaki et al. | 360/322 |
| 6,069,820 A | * | 5/2000 | Inomata et al. | 365/171 |
| 6,104,275 A | * | 8/2000 | Maeda | 338/32 R |
| 6,130,814 A | * | 10/2000 | Sun | 361/143 |
| 6,387,549 B1 | * | 5/2002 | Obata et al. | 428/692 |

FOREIGN PATENT DOCUMENTS

| | | | |
|---|---|---|---|
| JP | 5-266431 A | * | 10/1993 |
| JP | 9106913 | | 4/1997 |
| JP | 9121066 | | 5/1997 |
| JP | 9-162460 A | * | 6/1997 |
| JP | 9-214016 A | * | 8/1997 |
| JP | 9307156 | | 11/1997 |
| JP | 10-074309 A | * | 3/1998 |
| JP | 10098220 | | 4/1998 |
| JP | 10-162326 A | * | 6/1998 |
| JP | 10190090 | | 7/1998 |
| JP | 11-289115 A | * | 10/1999 |
| WO | WO 98/25263 | * | 6/1998 |

OTHER PUBLICATIONS

"Coupling of electronic charge and spin at a ferromagnetic–paramagnetic metal interface"; *Physical Review B*, vol. 37, No. 10, pp. 5312–5235; Apr. 1, 1988.
"Electronic analog of the electro–optic modulator"; School of Electrical Engineering, Purdue Univ., pp. 665–667; Dec. 5, 1989.

* cited by examiner

*Primary Examiner*—William Klimowicz
(74) *Attorney, Agent, or Firm*—Greer, Burns & Crain, Ltd.

(57) ABSTRACT

A magnetic sensor for reproducing information recorded on a magnetic recording medium senses an external magnetic field using a spin-filtered sensor current flowing through a non-magnetic layer.

5 Claims, 7 Drawing Sheets

FIG. 3A
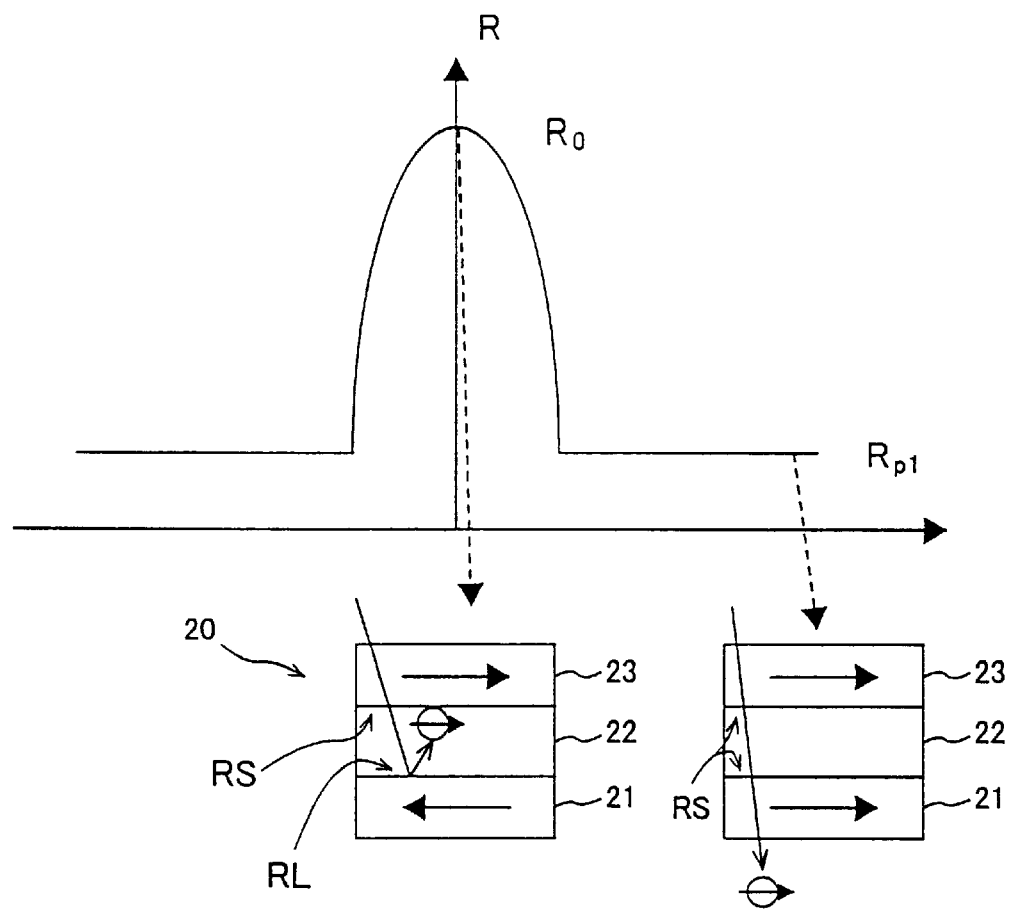
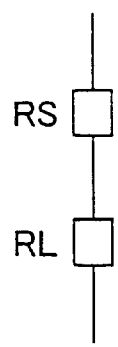
FIG. 3B
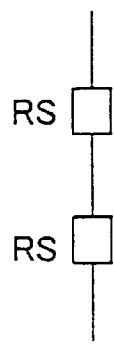
FIG. 3C

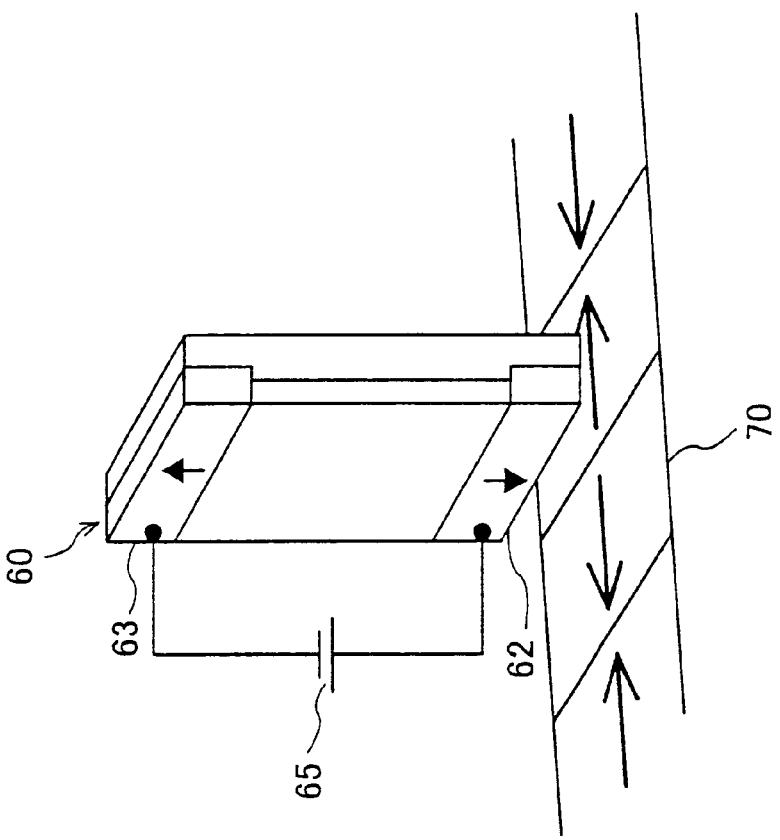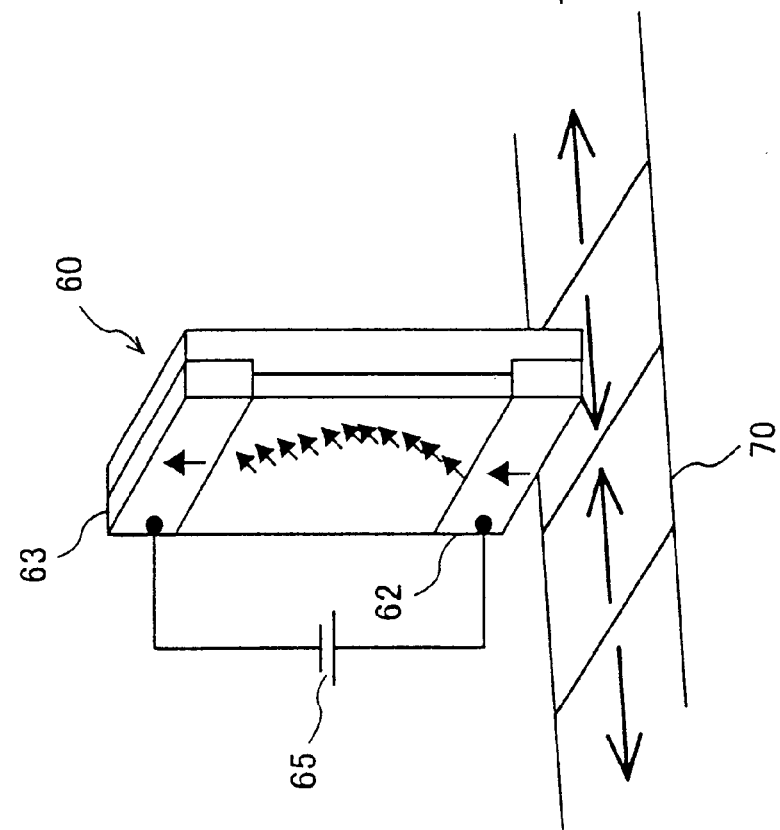

MAGNETIC SENSOR

BACKGROUND OF THE INVENTION

1. Field of the Invention

The present invention relates to a magnetic sensor, and more particularly, to a magnetic sensor that uses a spin-filtered sensor current to provide high-density recording and reproduction of information to and from a hard disk or other such magnetic recording medium.

2. Description of Related Art

Computers employing hard disk drives and other magnetic recording and reproduction units continue to require ever greater abilities to record information densely and to reproduce such densely recorded information accurately, which in turn means creating ever more sensitive magnetic sensors.

Specifically, as the recording density of the recording medium increases, the size of the leakage magnetic field (the signal magnetic field) from each bit decreases, which in turn has lead to proposals for magnetic reproduction heads mounting more sensitive sensors capable of detecting these reduced signal magnetic fields.

Conventionally, one well known type of sensor for reproduction heads is the magneto-resistive (MR) sensor employing the magneto-resistive effect. The MR sensor is of two types: an anisotropic magneto-resistive (AMR) film employing an anisotropic magneto-resistive effect, and a giant magneto-resistive (GMR) film which is a multi-layered structure.

A so-called spin-valve structure employing four basic layers is commonly used for the GMR film. The four layers of the spin-valve structure are an anti-ferromagnetic layer, a fixed magnetic layer, a non-magnetic metallic layer and a free magnetic layer.

Many proposals have been put forward to improve this basic structure, involving mainly improvements in the magnetic materials used and in their combination as well as changes in the number of layers used. However, the size of the signal magnetic fields from the ever more densely recorded magnetic recording medium continues to decrease at a rapid rate, such that mere improvements to the materials and structure of the MR sensor described above are unable to keep pace, that is, are unable to guarantee the level of sensitivity required to reproduce accurately the information recorded on the magnetic recording medium.

BRIEF SUMMARY OF THE INVENTION

Accordingly, it is an object of the present invention to provide a new and useful magnetic detector in which the above-described disadvantage is eliminated.

The above-described object of the present invention is achieved by a magnetic sensor that senses an external magnetic field using a spin-filtered sensor current flowing through a non-magnetic layer.

According to this aspect of the invention, the use of a spin-filtered sensor current flowing through a non-magnetic layer provides a magnetic sensor with improved sensitivity.

Additionally, the above-described object of the present invention is also achieved by the magnetic sensor as described above, further having:

a pair of ferromagnetic bodies provided on the non-magnetic layer and positioned parallel to an axis of magnetization of each of the ferromagnetic bodies; and a power source that uses the ferromagnetic bodies as electrodes to supply the sensor current.

Additionally, the above-described object of the present invention is also achieved by the magnetic sensor as described above, wherein:

a ferromagnetic film is provided on the non-magnetic layer; and an axis of magnetization of the ferromagnetic layer is formed either parallel to or opposite to a direction of electron spin of the sensor current.

Additionally, the above-described object of the present invention is also achieved by the magnetic sensor as described above, wherein the ferromagnetic layer is formed as a free layer constituting either an anisotropic magneto-resistive film or a giant magneto-resistive film.

Additionally, the above-described object of the present invention is also achieved by the magnetic sensor as described above, wherein:

the non-magnetic layer is formed of a semiconductor material; and the axis of magnetization of one of the pair of ferromagnetic bodies changes so as to detect an external magnetic field.

Other objects, features and advantages of the present invention will become more apparent from the following detailed description when read in conjunction with the accompanying drawings.

BRIEF DESCRIPTION OF THE DRAWINGS

FIGS. 3A, 3B and 3C are diagrams illustrating an operation of an MR sensor employing the magnetic sensor according to the present invention, and specifically, changes in a resistance of a magnetic layer in response to changes in direction of an external magnetic field, together with equivalent circuits thereto;

FIGS. 8A and 8B are diagrams illustrating an operation by which the magnetic sensor shown in FIG. 7 detects a magnetic field;

DETAILED DESCRIPTION OF THE INVENTION

A description will now be given of embodiments of the present invention, with reference to the accompanying drawings. It should be noted that identical or corresponding elements in the embodiments are given identical or corresponding reference numbers in all drawings, with detailed descriptions of such elements given once and thereafter omitted.

Generally, the magnetic sensor according to the present invention represents a new structure as compared to the conventional magnetic sensors using AMR or GMR structures. That is, the direction of magnetization of the ferromagnetic layers is set to be either parallel to or opposite to the spin of the electrons that make up the sensor current that flows through a non-magnetic layer. The direction of magnetization of one of the ferromagnetic layers then rotates when exposed to a signal magnetic field (external magnetic field) from the magnetic recording medium being read. When the direction of magnetization of the ferromagnetic layer is opposite to the spin orientation of the electrons, the magnetic resistance is at its strongest. When the direction of magnetization of the ferromagnetic layer is parallel to the spin orientation of the electrons, the magnetic resistance is at its weakest. This changing Magnetic Resistance Ratio (MRR) is greater than that of conventional MR sensors, and accordingly, the magnetic sensor of the present invention has greater sensitivity than the conventional MR sensors.

The magnetic sensor according to the present invention uses either changes in magnetic resistance or else switches a semiconductor material on and off to sense signal magnetic fields (external magnetic fields) from a recording medium.

A description will first be given of an MR sensor in which changes in magnetic resistance are used to detect changes in magnetic field. In this case, the basic structure of the magnetic sensor used in order to detect the signal magnetic fields from the magnetic recording medium involves a ferromagnetic layer and a non-magnetic layer. By maintaining a predetermined relation between the axis of magnetization of the ferromagnetic layer and the direction of spin of the electrons that form the sensor current flowing through the non-magnetic layer, the signal magnetic field emanating from the recording medium can be detected with a high degree of sensitivity.

Figure 1A:
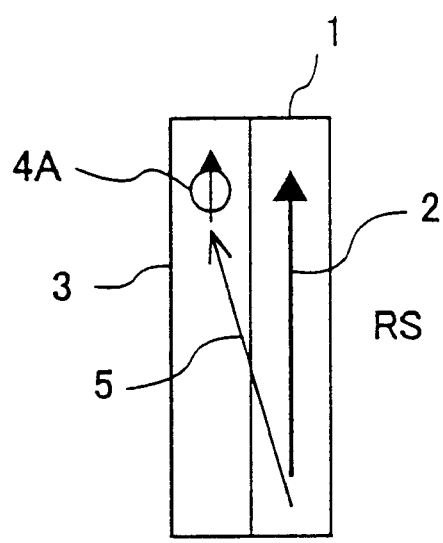
FIGS. 1A and 1B are schematic diagrams illustrating a basic structure of an MR sensor adapting the present invention.
Figure 1B:
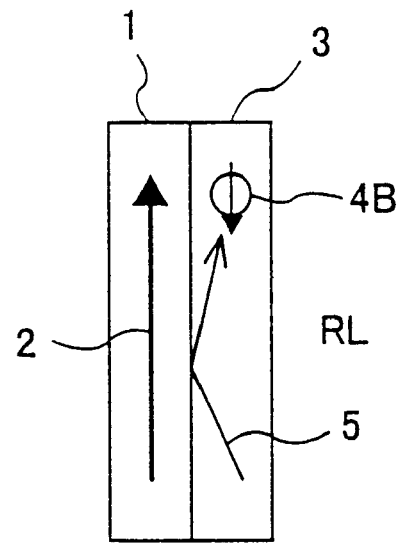

FIGS. 1A and 1B are schematic diagrams illustrating a basic structure of an MR sensor according to the present invention. In FIG. 1A, the direction of magnetization of the ferromagnetic layer and the direction of spin of the electrons of the sensor current flowing through the non-magnetic layer are parallel, whereas in FIG. 1B the two directions are opposed.

In the state depicted in FIG. 1A, the direction of magnetization of the ferromagnetic layer 1 is upward, with the electrons 5 that form the sensor current flowing from bottom to top. At this time, the movement of electrons 5 through the non-magnetic layer 3 is controlled so that the spin of the electrons is also toward the top of the diagram, as in spin electrons 4A. The method by which this spin control is accomplished will be explained later. In any case, the direction of magnetization of the ferromagnetic layer 1 and the direction of spin of the electrons 4A is parallel, such that any dispersion along the boundary between the ferromagnetic layer 1 and the non-magnetic layer 3 is minimal. Accordingly, a magnetic resistance R in the state depicted in FIG. 1A is a minimum value RS.

By contrast, the state shown in FIG. 1B is the opposite of the state shown in FIG. 1A. The direction of magnetization of the ferromagnetic layer 1 is upward, and the electrons 5 that form the sense current flow from bottom to top as is the case in FIG. 1A, but the direction of spin of the electrons 5 within the non-magnetic layer 3 is downward.

In the state shown in FIG. 1B, the direction of magnetization 2 of the ferromagnetic layer 1 and the spin direction of the electrons 4B are opposed, so the dispersion at the boundary between the ferromagnetic layer 1 and the non-magnetic layer 3 increases. Accordingly, the magnetic resistance R of the state shown in FIG. 1B is a maximum value RL.

The MR sensor of the present invention uses the states shown in 1A and 1B above to sense a signal magnetic field from the magnetic recording medium. In other words, by rotating the direction of magnetization 2 of the ferromagnetic layer 1 according to the signal magnetic field emanating from the magnetic recording medium to achieve the states shown in FIGS. 1A and 1B above, the MRR can be increased and thus detection sensitivity improved.

The above-described MRR can be defined using the following formula, by which the MRR is calculated using both the maximum magnetic resistance value RL obtained when the magnetization direction 2 of the ferromagnetic layer 1 and the direction of the spin electron 4B are opposed as well as the minimum magnetic resistance value RS obtained when the magnetization direction 2 of the ferromagnetic layer 1 and the direction of the spin electron 4B are parallel:

$$MRR=(RL-RS)/RL=1-RS/RL \qquad (1)$$

Here, a description will be provided of how the MR sensor of the present invention provides an MRR calculated as per the above formula (1) that is greater than that which the conventional MR sensor can provide.

Figure 2A:
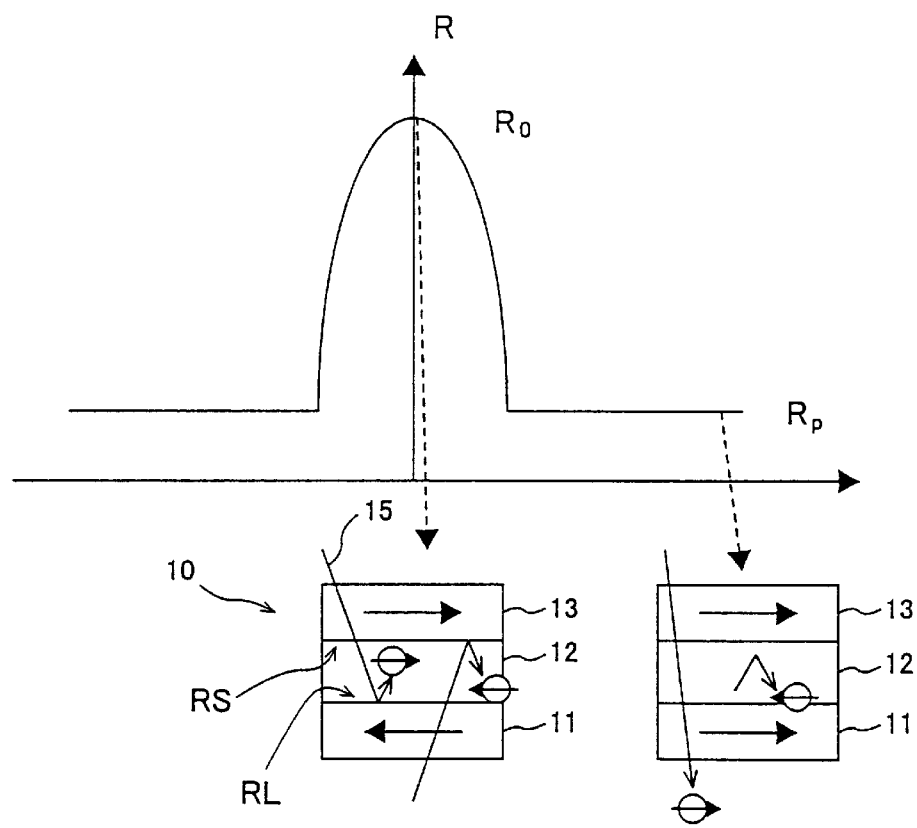
FIGS. 2A, 2B and 2C are diagrams illustrating the operating principles of a conventional sensor employing a GMR structure, and specifically, changes in a resistance of a magnetic layer in response to changes in direction of an external magnetic field, together with equivalent circuits thereto.
Figure 2B:
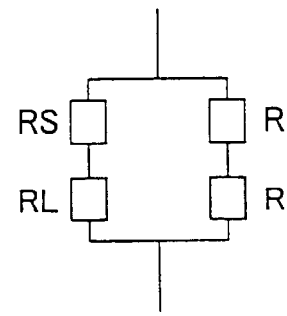
Figure 2C:
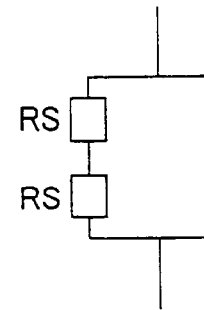

FIGS. 2A, 2B and 2C are diagrams illustrating the operating principles of a conventional MR sensor employing a GMR structure, and specifically, changes in a resistance of a magnetic layer in response to changes in direction of an external magnetic field as well as equivalent circuits thereto.

As shown in FIG. 2A, the conventional GMR structure 10 includes, from bottom up, a free magnetic layer 11, a non-magnetic layer 12 and a fixed magnetic layer 13. It should be noted that the actual GMR structure 10 also has an anti-ferromagnetic layer, a bias layer, and so forth, although in this diagram only those layers that affect changes in the magnetic resistance are included.

In the conventional GMR structure 10, the sensor current that flows through the non-magnetic layer 12 is not subjected to forces that would control the spin of the electrons and hence is not in a spin-filtered state. Accordingly, electrons with an upward spin orientation and a downward spin orientation are mixed together and each behaves independently.

As a result, as shown in FIG. 2B, in which the direction of magnetization of the free magnetic layer 11 and the direction of magnetization of the fixed magnetic layer 13 are opposed, the electrons 15, depending on their direction of spin, either encounter a small resistance RS at a boundary of the free magnetic layer 11 and a large resistance RL at a boundary layer of the fixed magnetic layer 13, or conversely, encounter a large resistance RL at the boundary of the free magnetic layer 11 and a small resistance RS at the fixed magnetic layer 13. (It should be noted that in FIG. 2A the GMR structure 10 is shown as being on its side, unlike in FIGS. 1A and 1B, so the spin orientation is shown as horizontal instead of vertical.)

Additionally, as shown in FIG. 2C, when the direction of magnetization of the free magnetic layer 11 and the fixed magnetic layer 13 are parallel, the electrons 15 that form the sense current, depending on their spin direction, either acquire a small resistance RS at the boundary of the fixed magnetic layer 13 and a small resistance at the boundary of the free magnetic layer 11, or they encounter a large resistance RL at the boundary of the fixed magnetic layer 13 and a large resistance RL at the boundary of the free magnetic layer 11.

As described above, with the conventional MR sensor using the conventional GMR structure, there is no attempt to control the spin of the electrons inside the non-magnetic layer. As a result, there are two types of resistance states regardless of whether the directions of magnetization of the free magnetic layer 11 and the fixed magnetic layer 13 are parallel or opposed, and it is these states which determine the resistance change values.

However, as described above, what is shown in FIG. 2B above is a state in which the direction of magnetization of the free magnetized layer 11 and the direction of magnetization of the fixed magnetized layer 13 are opposed, with the magnetic resistance R shown in the upper part of FIG. 2A at a maximum value Ro. The magnetic resistance R of the GMR structure 10 at this time can be ascertained using the equivalent circuit shown in FIG. 2B. That is, the maximum magnetic resistance Ro shown in 2A can be obtained by this formula: Ro=(RL+RS)/2.

Additionally, as described above, what is shown in FIG. 2C is a state in which the direction of magnetization of the free magnetized layer 11 and the direction of magnetization of the fixed magnetized layer 13 are parallel, with the magnetic resistance R shown in the upper part of FIG. 2A at a minimum value Rp. The magnetic resistance R of the GMR structure 10 at this time can be ascertained using the equivalent circuit FIG. 2C. That is, the minimum magnetic resistance Rp shown in 2(b) can be obtained by this formula: Rp=2RL·RS/(RL+RS).

Then, the MRR of the conventional MR sensor using the GMR structure 10 shown in FIG. 2A can be obtained in the same way as with formula (1) by using the following formula (2):

$$MRR=(Ro-Rp)/Ro=1-4RL \cdot RS/(RL+RS)^2 \quad (2)$$

Accordingly, given these values for Ro and Rp, the MRR of the conventional GMR structure is approximately 10 percent, so by substituting 0.1 for the MRR in formula (2) above and solving the quadratic equation, we obtain RS/RL=0.52 Then, by substituting RS/RL=0.52 into formula (1) described above for the magnetic sensor of the present invention, we obtain an MRR of 48 percent. Accordingly, the MRR shows an approximate fivefold increase over the conventional model, and if used as the magnetic sensor in a magnetic head would clearly be able to sense signal magnetic fields with a high degree of sensitivity.

Next, in contrast to the MR sensor employing the conventional GMR structure shown in FIG. 2A, a description will be given of an MR sensor employing a GMR structure according to the present invention, with reference initially to FIGS. 3A, 3B and 3C.

FIGS. 3A, 3B and 3C are diagrams illustrating an operation of an MR sensor employing a GMR structure according to the present invention, and specifically, changes in resistance of a magnetic layer in response to changes in direction of an external magnetic field.

As shown in FIG. 3A, a GMR 20 according to the present invention also includes, from bottom up, a free magnetic layer 21, a nonmagnetic layer 22 and a fixed magnetic layer 23. However, unlike the conventional arrangement described above, the GMR 20 shown in FIG. 3A gives the electrons of the sensor current flowing inside the non-magnetic layer 22 a right-hand spin.

In the GMR structure according to the present invention, the electron spin is controlled so as to be of one direction only, so that the two types of magnetic resistance states for each of the conditions shown in the lower part of FIG. 2A in the conventional arrangement do not arise but, instead, only one such resistance state exists for each of the two conditions shown. In other words, in the state shown on the lower left side of FIG. 3A, in which a direction of magnetization of a free magnetic layer 21 and a direction of magnetization of a fixed magnetic layer 23 are opposed, the boundary of the fixed magnetic layer 23 with the non-magnetic layer 22 acquires a small resistance RS and only a small resistance RS, and, simultaneously, the boundary of the free magnetic layer 21 acquires a large resistance RL and only a large resistance RL. Additionally, in the state shown on the lower right side of FIG. 3A, in which the direction of magnetization of the free magnetic layer 21 and the direction of magnetization of the fixed magnetic layer 23 are parallel, the boundary of the free magnetic layer 21 with the non-magnetic layer 22 acquires a small resistance RS and only a small resistance RS, and the boundary of the fixed magnetic layer 23 acquires a large resistance RL and only a large resistance RL.

Thus, the MR sensor shown in FIG. 3A forms only a single resistance state for each of the conditions shown therein. The maximum MRR of the GMR structure 20 can be obtained by reference to the equivalent circuits shown in FIG. 3B and FIG. 3C, such that Ro=RL+RS. Similarly, the minimum MRR of the GMR structure 20 can be obtained by reference to the equivalent circuit (d) given below (b), such that Rp1=2Rs. If then the MRR is expressed in terms of formulas such as (1) and (2) above, then $$MRR=(Ro-Rp1)/Ro=1-2Rs/(RL+RS) \quad (3)$$

Assuming as described above that the conventional GMR structure has an MRR of 0.1 and therefore an RS/RL=0.52, then substituting that RS/RL value into formula (3) above yields an MRR of 31%. Accordingly, the present invention approximately triples the MRR of an MR sensor using a GMR structure as described above, and is thus capable of being employed as the magnetic sensor in a reproduction head. As will be appreciated by those of ordinary skill the art, the GMR 20 depicted in FIG. 3A can be constructed by converting the two ferromagnetic layers 1 shown in FIG. 1 into the free magnetic layer 21 of FIG. 3A and by converting the non-magnetic layer 3 into the non-magnetic layer 22.

Figure 4:
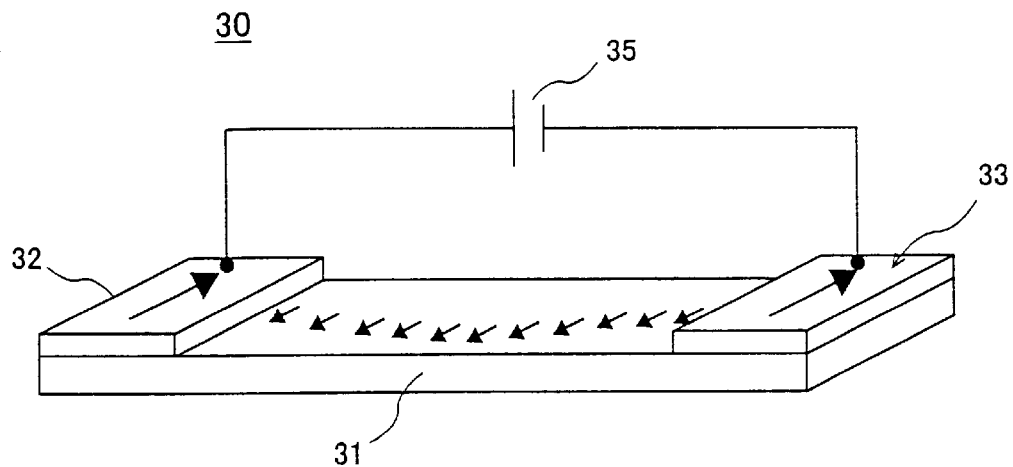
FIG. 4 is a schematic diagram showing a basic structure of a spin filter.

FIG. 4 is a schematic diagram showing a basic structure of a spin filter, employed for the purpose of filtering the spin of the electrons that form the sensor current that flows through the non-magnetic layer.

As shown in FIG. 4, a pair of ferromagnetic bodies are disposed one at each end of a non-magnetic layer 31. The ferromagnetic bodies 32, 33 are electrically conductive and function as terminal electrodes.

The non-magnetic layer 31 can be made of some electrically conductive non-magnetic material such as aluminum, copper, chromium or some alloy of these. Additionally, the ferromagnetic bodies can be formed of a conductive ferromagnetic material selected from among iron, cobalt, nickel or an alloy of these. Attaching a power source 35 to the ferromagnetic bodies 32, 33 in order to supply the sense current forms the basic structure of the spin filter.

When, as shown in FIG. 4, the axes of magnetization of the ferromagnetic bodies 32, 33 are parallel, the spin of the electrons passing through the non-magnetic layer 31 between the ferromagnetic bodies 32, 33 can be polarized when an electric current is supplied from the power source 35. Such a configuration is disclosed for example by Johnson and Silsbee in Phys. Rev. B 37, 5326 (1988), though no application of the principle is suggested. The inventors confirm that an embodiment of the present invention can be achieved using the above-described spin filter 30 basic structure, in which ferromagnetic layers are contacted with a non-magnetic layer 31.

A description will now be given of further embodiments of the present invention, with reference to the accompanying drawings.

Figure 5:
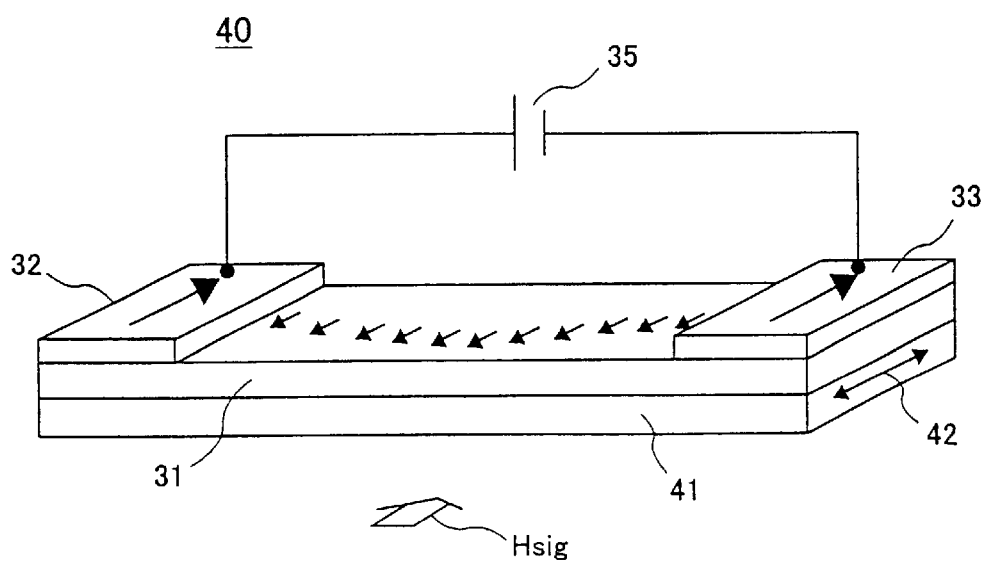
FIG. 5 is a diagram showing a magnetic sensor according to a first embodiment of the present invention.

FIG. 5 is a diagram showing a magnetic sensor according to a first embodiment of the present invention.

The MR sensor 40 according to the first embodiment is a simple structure, in which an AMR structure 41 adjoins a bottom surface of the spin filter 30. The AMR structure 41 may be made of the conventional permalloy or Sendust. The axis of magnetization 42 of the AMR structure 41 is set so as to be either parallel to or opposed to the direction of spin of the electrons of the non-magnetic layer 31. When exposed to an external signal magnetic field Hsig the direction of magnetization 42 of the AMR structure 41 rotates, detecting magnetically recorded information as changes in magnetic resistance. The two-layer MR sensor of the present embodiment owes its improved sensitivity to a fivefold increase in MRR as compared to the conventional MR sensor described above.

The above-described MR sensor 40 can be manufactured by commonly known thin film technologies, such as, for example, spattering, photolithography using resist masks, and etching methods. The relatively simple structure of the present embodiment, in which a pair of ferromagnetic bodies are formed atop two layers, makes it possible to produce a highly sensitive MR sensor easily.

Figure 6:
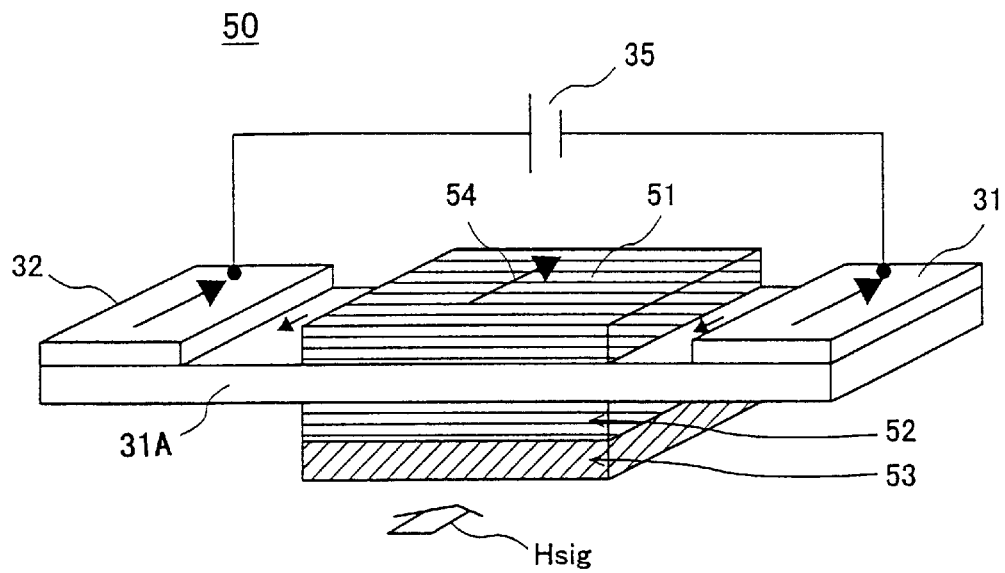
FIG. 6 is a diagram showing a magnetic sensor according to a second embodiment of the present invention.

FIG. 6 is a diagram showing a magnetic sensor according to a second embodiment of the present invention.

As shown in FIG. 6, an MR sensor 50 employs a spin-valve structure on a GMR structure. The spin-valve structure is a multilayer structure employing a free magnetic layer, a non-magnetic layer, a fixed magnetic layer and an antimagnetic layer. The free magnetic layer and the non-magnetic layer, as described above, are designed to control the electron spin by means of the spin filter 30 described above.

The spin valve type MR sensor 50 of the second embodiment has a free magnetic layer 51 on top of the non-magnetic layer 31A, and, below the non-magnetic layer 31A, a fixed magnetic layer 52 and an anti-ferromagnetic layer 53 for pinning the fixed magnetic layer 52.

The above-described spin-valve structure can be formed using conventional thin film technology. The direction of magnetization 54 of the free magnetic layer 51 is set to be either parallel to or opposed to the direction of spin of the electrons of the non-magnetic layer 31A. When exposed to an external signal magnetic field Hsig, the direction of magnetization 54 of the free magnetic layer 51 rotates, detecting magnetically recorded information as changes in magnetic resistance. The MR sensor using the spin-valve structure shown in the second embodiment described above owes its improved sensitivity to the threefold increase in MRR as compared to the conventional MR sensor described above with reference to FIG. 3.

Figure 7:
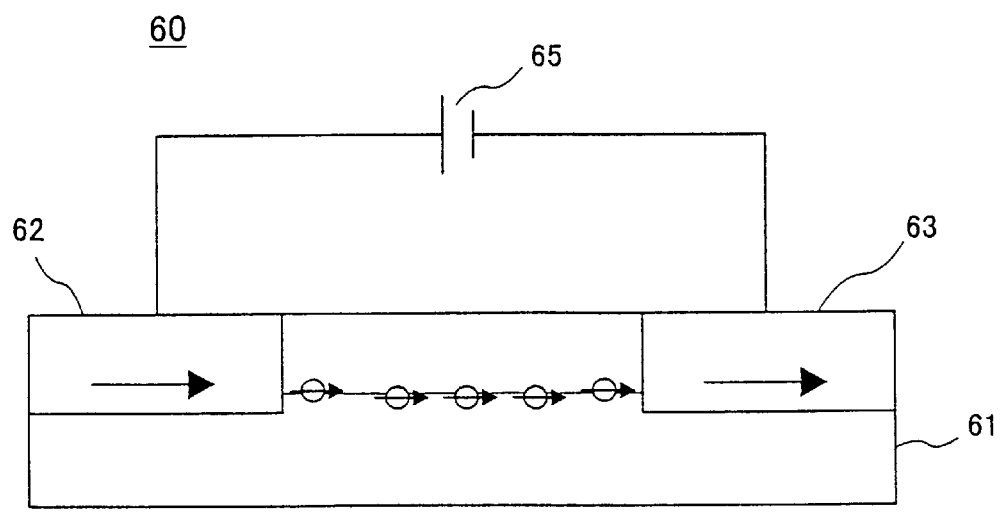
FIG. 7 is a diagram showing a magnetic sensor according to a third embodiment of the present invention.

FIG. 7 is a diagram showing a magnetic sensor according to a third embodiment of the present invention.

As described above, the first and second embodiments used changes in magnetic resistance arising from the relation between the direction of magnetization of the ferromagnetic layers and the direction of spin of the electrons that form the sensor current that flows through the non-magnetic layer in order to detect an external magnetic field. The third embodiment is an FET-type magnetic sensor, in which the non-magnetic layer is formed of a semiconductor material and which detects the presence of an external magnetic field by switching ON and OFF.

The magnetic sensor 60 has a structure like that of the spin filter 30 shown in FIG. 4. Ferromagnetic bodies 62, 63 are disposed one at each end atop the non-magnetic layer 61 and function as electrodes. The axes of magnetization of the ferromagnetic bodies 62, 63 are set parallel (in the case of FIG. 7, both move to the right).

As described above, the non-magnetic layer is made of a semiconductor material, for example indium aluminum arsenide or indium gallium arsenide, so that when an electric current is supplied to the ferromagnetic bodies 62, 63 from the power source 65, as shown in FIG. 7 a spin-filtered sensor current flows through the non-magnetic layer. It should be noted that the principle of a spin-filtered FET is disclosed for example in S. Datra and B. Das, Appl. Phys. Lett. 56 665 (1990), though no mention is made of the applications of such a structure.

In the magnetic sensor according to the third embodiment of the present invention, the spin-filtered FET is used to detect the signal magnetic field emanating from the magnetic recording medium, the operation of which is described with reference to FIGS. 8A and 8B.

FIGS. 8A and 8B are diagrams illustrating an operation by which the magnetic sensor shown in FIG. 7 detects a magnetic field.

In both FIGS. 8A and 8B, the above-described magnetic sensor 60 is disposed perpendicular to a magnetic recording medium which, in this case, is a hard disk 70. FIG. 8A shows detection at a position at which adjacent magnetizations recorded on the surface of the disk come together, and FIG. 8B shows detection at a position at which adjacent magnetizations recorded on the surface of the disk face away from each other.

In FIG. 8A, the direction of the signal magnetic field emanating from the hard disk 70 and the direction of magnetization of the ferromagnetic body 62 are parallel, the spin-filtered sensor current shown in FIG. 7 flows from the ferromagnetic body 62 to the ferromagnetic body 63, and the semiconductor turns ON. Conversely, in FIG. 8B, the direction of the signal magnetic field emanating from the hard disk 70 and the initial direction of magnetization of the ferromagnetic body 62 are opposed, thus causing the magnetization direction of the ferromagnetic body 62 to invert so as to become parallel with the direction of the signal magnetic field. As a result, a state in which the sensor current shown in FIG. 7 flows cannot be maintained, the ferromagnetic body 62 and the ferromagnetic body 63 become electrically insulated from each other and the semiconductor turn OFF. Accordingly, in the third embodiment of the present invention the magnetic sensor uses the switching effect of a semiconductor to detect the external magnetic field.

As can be appreciated by those skilled in the art, the magnetic sensor 60 can be manufactured using conventional semiconductor production technology or thin film technology. The ferromagnetic bodies 62 and 63 can be formed from an electrically conductive ferromagnetic material such as, for example, iron, cobalt, nickel, or an alloy of these metals. Additionally, both the ferromagnetic bodies 62 and 63 need not be made of the same material. However, the direction of magnetization of the ferromagnetic body 62 must be capable of rotating upon contact with a signal magnetic field while the direction of magnetization of the ferromagnetic body 63 must remain fixed in a single direction.

A description will now be given of a magnetic recording and/or reproduction device employing the magnetic sensor described above as a reproduction head, with reference to FIGS. 9 and 10.

Figure 9:
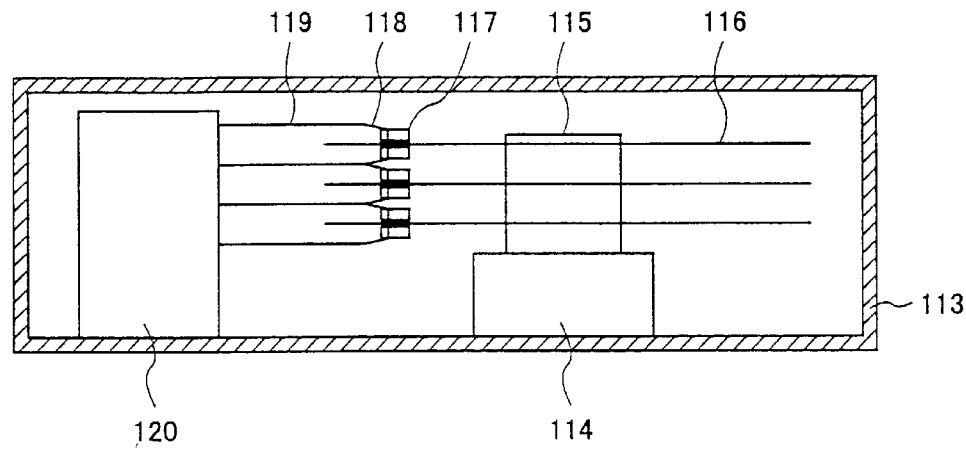
FIG. 9 is a lateral cross-sectional view of a magnetic recording and/or reproduction device employing the magnetic sensor according to the present invention.

FIG. 9 is a lateral cross-sectional view of a magnetic recording and/or reproduction apparatus (hereinafter magnetic recording/reproduction apparatus) employing the magnetic sensor according to the present invention. FIG. 10 is a diagram showing a plan view of the magnetic recording/reproduction apparatus shown in FIG. 9. The reproduction head used in the magnetic recording/reproduction apparatus employs a spin-filtered sensor current to detect information recorded on a magnetic recording medium.

Figure 10:
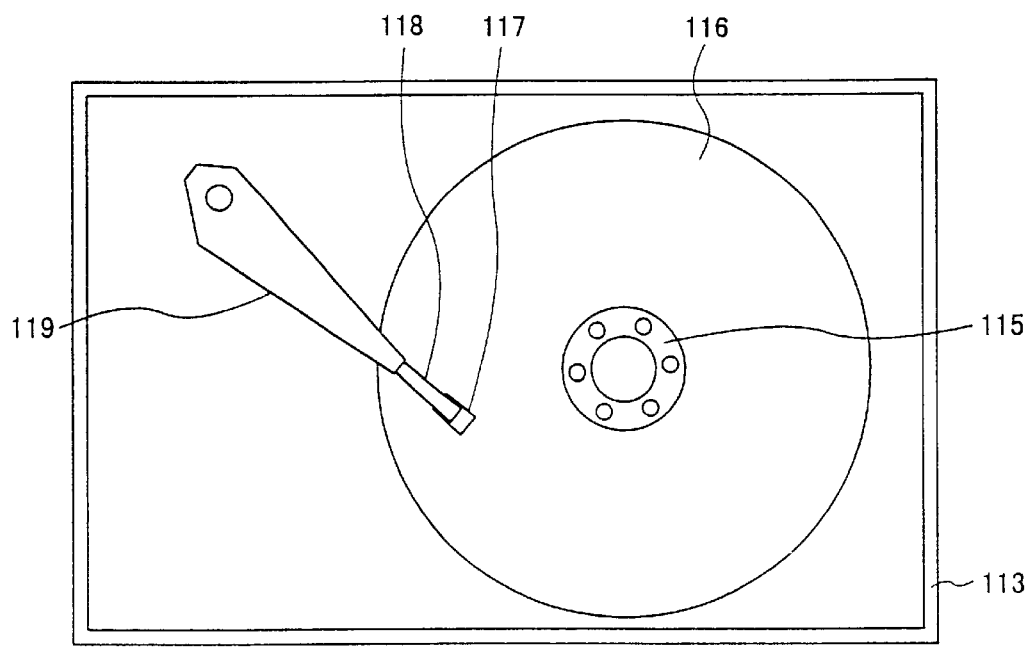
FIG. 10 is a diagram showing a plan view of the magnetic recording and/or reproduction device shown in FIG. 9.

As shown in FIGS. 9 and 10, the magnetic recording/reproduction apparatus comprises a housing 113 and, inside the housing 113, a motor 114, a hub 115, a plurality of magnetic recording media 116, a plurality of recording/reproduction heads 117, a plurality of suspensions 118, and a plurality of arms 119 and actuator units 120.

The recording media 116 are mounted on the hub 115, which is in turn rotated by the motor 114. Each of the recording/reproduction heads 117 is a compound head consisting of a reproduction head shown in any one of FIGS. 5, 6 and 7 as well as an inductive type recording head. Each recording/reproduction head 117 is mounted at a tip of a corresponding arm 119 via the suspension 118. Each arm 119 is driven by an actuator unit 120. The basic structure of the magnetic recording/reproduction apparatus as such is well known and so a detailed description thereof will be omitted. Moreover, the number of magnetic recording media 116 is not limited to three but may be 1, 2, or 4 or more such media. Additionally, the types of magnetic recording media need not be limited to the magnetic disks used here.

The above description is provided in order to enable any person skilled in the art to make and use the invention and sets forth the best mode contemplated by the inventors of carrying out the invention.

The present invention is not limited to the specifically disclosed embodiments, and variations and modifications may be made without departing from the scope and spirit of the present invention.

The present application is based on Japanese Priority Application No. 2000-175863, filed on Jun. 12, 2000, the contents of which are hereby incorporated by reference.

What is claimed is:

1. An anisotropic magneto-resistive magnetic sensor that senses an external magnetic field comprising:

a non-magnetic layer constituting a part of the magnetic sensor, the non-magnetic layer providing a current path of a sensor current;

a current source for supplying the sensor current to the non-magnetic layer such that the sensor current flows through the non-magnetic layer;

a spin-filter interposed between the non-magnetic layer and the current source, the spin filter filtering a spin polarization of electrons in the sensor current; and a ferromagnetic layer adjacent to said non-magnetic layer, said ferromagnetic layer changing a direction of magnetization thereof in response to an external magnetic field.

2. The magnetic sensor as claimed in claim 1, further comprising:

a pair of ferromagnetic bodies provided on the non-magnetic layer and positioned such that axes of magnetization of the pair of ferromagnetic bodies are aligned parallel with each other, the pair of ferromagnetic bodies forming together the spin-filter, the pair of ferromagnetic bodies functioning as electrodes to supply the sensor current.

3. The magnetic sensor as claimed in claim 2, wherein each of the pair of ferromagnetic bodies are formed from a material selected from a group consisting of iron, cobalt, nickel, or an alloy of these metals.

4. The anisotropic magneto-resistive magnetic sensor as claimed in claim 1, wherein the non-magnetic layer is formed from a material selected from a group consisting of aluminum, copper, chromium, or an alloy of these metals.

5. A device for magnetically recording and reproducing information to and from a recording medium, comprising:

a magnetic head having an anisotropic magneto-resistive magnetic sensor that senses an external magnetic field, said anisotropic magneto-resistive sensor comprising:

a non-magnetic layer constituting a part of the magnetic sensor, the non-magnetic layer providing a current path of a sensor current;

a current source for supplying the sensor current to the non-magnetic layer such that the sensor current flows through the non-magnetic layer;

a spin-filter interposed between the non-magnetic layer and the current source, the spin filter filtering a spin polarization of electrons in the sensor current; and a ferromagnetic layer provided adjacent to said non-magnetic layer, said ferromagnetic layer changing a direction of magnetization thereof in response to an external magnetic field.

* * * * *